United States Patent
Bray

(10) Patent No.: US 6,529,961 B1
(45) Date of Patent: Mar. 4, 2003

(54) NETWORK TRANSCEIVER HAVING MEDIA INDEPENDENT INTERFACE OPERABLE IN A GENERAL PURPOSE SERIAL INTERFACE MODE

(75) Inventor: Michael Richard Bray, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/289,950

(22) Filed: Apr. 13, 1999

Related U.S. Application Data

(60) Provisional application No. 60/082,183, filed on Apr. 17, 1998.

(51) Int. Cl.[7] .............................................. G06F 15/16
(52) U.S. Cl. ...................... 709/250; 709/230; 709/231; 709/232; 709/238; 710/65; 710/71
(58) Field of Search ................................. 709/230, 231, 709/232, 238, 250; 710/62, 65, 71; 365/189.05

(56) References Cited

U.S. PATENT DOCUMENTS

| | | | | |
|---|---|---|---|---|
| 5,784,370 A | * | 7/1998 | Rich | 370/395 |
| 5,864,309 A | * | 1/1999 | Hung | 341/61 |
| 5,907,719 A | * | 5/1999 | Nimishakavi | 710/71 |
| 5,995,514 A | * | 11/1999 | Lo | 370/463 |
| 6,031,767 A | * | 2/2000 | Schuh et al. | 365/189.05 |
| 6,044,087 A | * | 3/2000 | Muller et al. | 370/463 |
| 6,058,427 A | * | 5/2000 | Viswanath et al. | 709/231 |
| 6,069,897 A | * | 5/2000 | Perlman et al. | 370/420 |
| 6,108,726 A | * | 8/2000 | Runaldue et al. | 710/62 |
| 6,130,891 A | * | 10/2000 | Lam et al. | 370/401 |
| 6,222,852 B1 | * | 4/2001 | Gandy | 341/110 |
| 6,269,104 B1 | * | 7/2001 | McLaughlin et al. | 370/464 |
| 6,430,695 B1 | * | 8/2002 | Bray et al. | 375/211 |

* cited by examiner

Primary Examiner—Nabil El-Hady

(57) ABSTRACT

A novel network transceiver having a Media Independent Interface (MII) operating at 10 Mb/s or 100 Mb/s for connecting the transceiver to a repeater or hub device. A serial interface select signal can be asserted to configure the MII to operate as a General Purpose Serial Interface (GPSI) for 10 Mb/s data. The least significant transmit and receive data pins of the MII are respectively mapped to transmit and receive data pins of the GPSI. A circuit for enabling MII to operate in a GPSI mode has a transmit multiplexer controlled by the serial interface select signal to bypass a parallel-to-serial converter that transforms parallel transmit MII data into a serial data stream, and a receive multiplexer controlled by the serial interface select signal to bypass a serial-to-parallel converter that transforms serial receive data stream into parallel receive MII data.

17 Claims, 3 Drawing Sheets

NETWORK TRANSCEIVER HAVING MEDIA INDEPENDENT INTERFACE OPERABLE IN A GENERAL PURPOSE SERIAL INTERFACE MODE

This application claims priority from provisional patent application serial No. 60/082,183 filed on Apr. 17, 1998, and entitled "Quad Fast Ethernet Transceiver for 10 BASE-T/100 BASE-X (QFEX 10/100)," the entire disclosure of which is incorporated by reference herein.

TECHNICAL FIELD

The present invention relates to network interfacing, and more particularly to a novel network transceiver having a Media Independent Interface (MII) operable in a General Purpose Serial Interface (GPSI) mode.

BACKGROUND ART

A Local Area Network, or (LAN), is a communication system that provides a connection among a number of independent computing stations within a small area, such as a single building or group of adjacent buildings. One type of network structure uses one or more repeaters in a star topology, with each repeater having several ports. A data packet received at one port is retransmitted to all other ports of the repeater. Each repeater in turn restores timing and amplitude degradation of data packets received at one port and retransmits the packets to all other ports.

Traditional Ethernet networks (10BASE-T) operate at 10 Mb/s Ethernet protocol, as described by IEEE Standard 802.3; the majority of Ethernet interfaces currently operate at this data rate. However, a newer Ethernet standard, under IEEE standard 802.3u, accomplishes the faster operation of 100 BASE-T systems, at a 100 Mb/s data rate (i.e., a 125 Mb/s encoded bit rate) using unshielded twisted pair (UTP) physical media. The 100 BASE-T standard defines operation over two pairs of category 5 UTP (100 BASE-TX) or category 3 UTP. The 100 BASE-FX network medium, covered by the 100 BASE-T standard, allows operation over dual fiber optic cabling.

Ethernet protocol provides for a Media Access Control (MAC), enabling network interface devices at each network node to share accesses to the network medium. One type of connection, termed a Media Independent Interface, or MII, connects the MAC to a physical layer (PHY) transceiver configured for a particular network medium, e.g., 10 BASE-T, 100 BASE-FX, or 100 BASE-TX. The physical layer transceiver is configured for converting the MII protocol signals output by the MAC into analog network signals, such as Multiple Layer Transition-3 (MLT-3) signals for 100 Mb/s Ethernet networks, or Manchester-encoded signals for 10Mb/s Ethernet networks.

As defined in the IEEE 802.3 standard, the MII supports a parallel MAC interface to the PHY device. A serial interface such as the IEEE 802.3 compliant General Purpose Serial Interface (GPSI) is required to support a serial MAC interface to the PHY device. Thus, to be able to communicate via parallel and serial MAC interfaces, the PHY transceiver needs separate MII and GPSI pins. However, it would be desirable to reduce the pin count of the PHY transceiver by using MII for supporting not only a parallel MAC interface but also a serial MAC interface.

DISCLOSURE OF THE INVENTION

The invention provides a novel network transceiver for transferring network signals between a media access control (MAC) device and a link partner in a local area network, such as one conforming to Ethernet/IEEE 802.3 Standard.

The transceiver comprises a physical layer device, a parallel interface for connecting the physical layer device and the MAC device, and a circuit for enabling the parallel interface to operate in a serial interface mode to transfer a serial data stream. For example, the transceiver may be integrated on a single chip.

In accordance with one aspect of the invention, the parallel interface is a media independent interface (MII) conforming to IEEE Std. 802.3u. The enabling circuit allows the MII to operate as a General Purpose Serial Interface (GPSI).

Preferably, the physical layer device includes first and second data rate paths selected based on a rate of data communication with the link partner. The first data rate path generates the corresponding network signals at 100 Mb/s, and the second data rate path generates the corresponding network signals at 10 Mb/s.

The enabling circuit places the MII into the GPSI mode only for 10 Mb/s data.

A serial mode select signal is asserted to enable the MII to operate in the GPSI mode.

Various objects and features of the present invention will become more readily apparent to those skilled in the art from the following description of specific embodiment thereof, especially when taken in conjunction with the accompanying drawings.

BEST MODE FOR CARRYING OUT THE INVENTION

Figure 1:
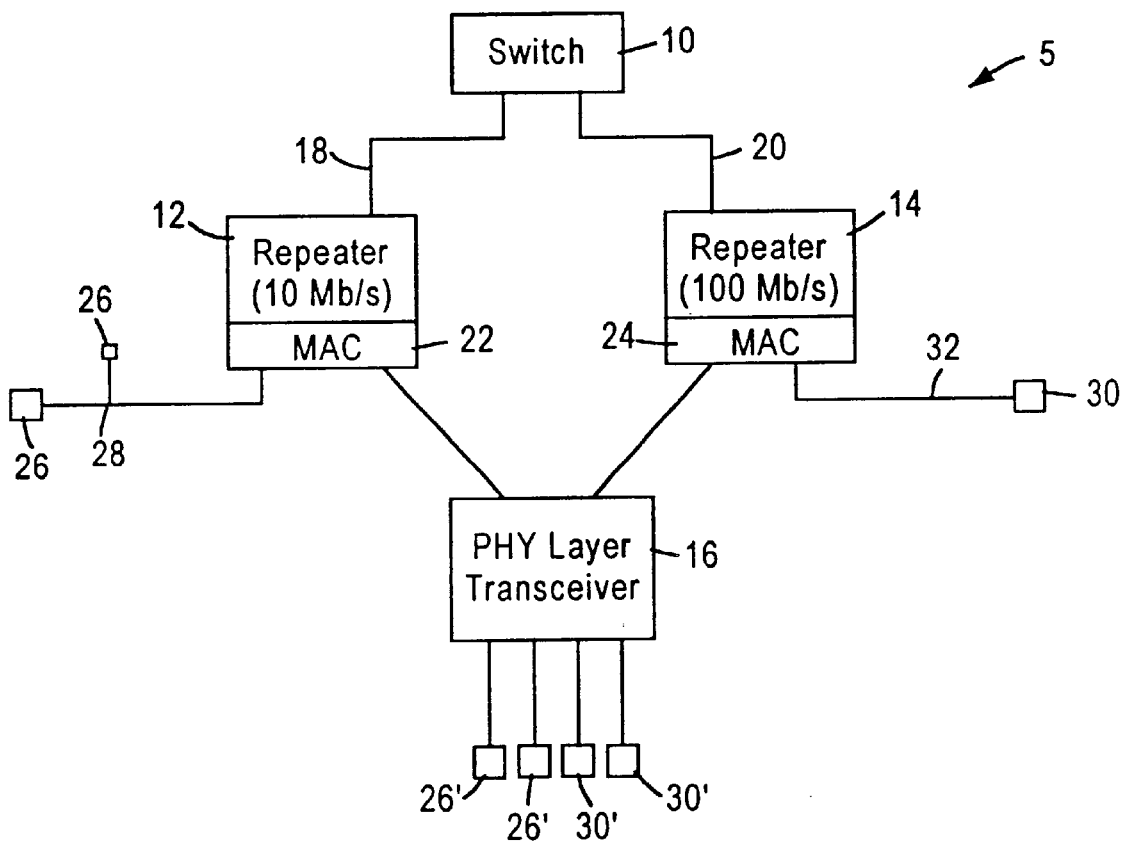
FIG. 1 is a diagram of a local area network, in which the present invention may be implemented.

FIG. 1 is a block diagram of an exemplary local area network architecture in which the present invention may be implemented. As shown in FIG. 1, the network 5 includes a network switch 10, a repeater 12 operating at a first data rate such as 10 Mb/s, a second repeater 14 operating at a second data rate such as 100 Mb/s, and a multiple port physical layer (PHY) transceiver 16. The switch 10 and the repeater 12 transfer network data via a data link 18 operating at the first data rate of 10 Mb/s. The switch 10 and the repeater 14 transfer data via a different data link 20 operating at the second data rate of 100 Mb/s. The repeaters 12 and 14 may communicate with the PHY transceiver 16 via Media Access Control (MAC) interfaces 22 and 24, respectively. As recognized in the art, the repeater 12 may also transfer network data to individual network workstations 26 operating at 10 Mb/s via a shared medium 28, and the repeater 14 may transfer data to network workstations 30 operating at 100 Mb/s via a network medium 32.

The multiple port physical layer transceiver 16 enables multiple workstations 26', 30' having different data rates of 10 Mb/s and 100 Mb/s, respectively, to communicate with the repeater interfaces 22 and 24. Moreover, the physical layer transceiver 16 enables the network data from different workstations 26' and 30' to be automatically supplied (i.e., steered) to the appropriate data rate domain, enabling more flexible implementation of multiple-rate networks.

Figure 2:
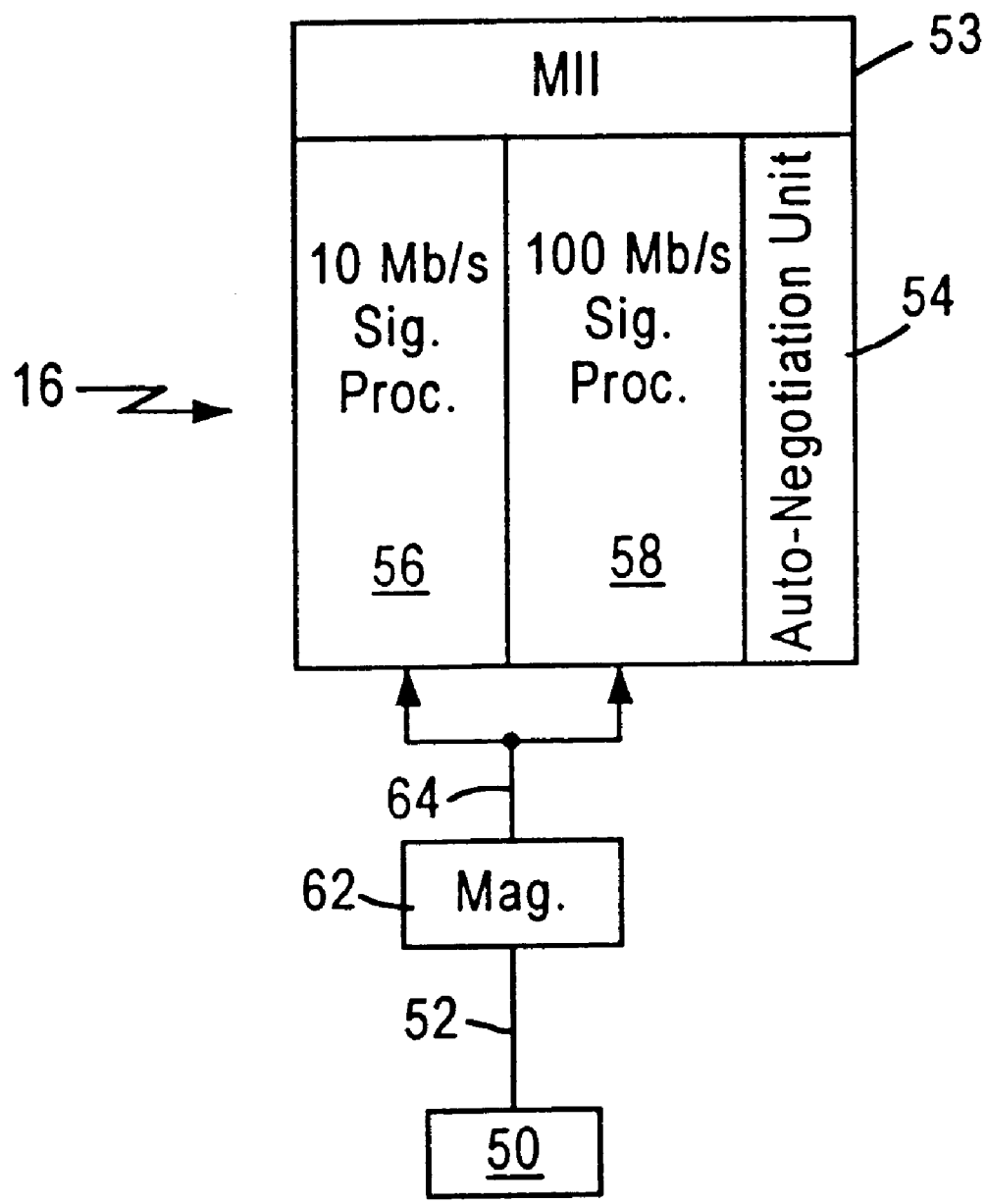
FIG. 2 is a simplified diagram of a single-port network transceiver of the present invention.

FIG. 2 shows a PHY transceiver 16 for establishing a communication path between a link partner 50 on a network medium 52 and one repeater interface from among a plurality of repeater interfaces that is data rate compatible with the operating speed (i.e., link speed) of the link partner 50. Although a single-port PHY transceiver 16 is illustrated in FIG. 2, the transceiver may have multiple ports for connecting multiple link partners 50.

The transceiver 16 has a Media Independent Interface (MII) 53 operating at 10 Mb/s or 100 Mb/s for connecting the transceiver to the MAC engine of the corresponding repeater. An auto-negotiation unit 54 determines the speed of operation of link partner 50 on the network medium 52 using the auto-negotiation technique defined in the IEEE 802.3u standard.

The transceiver 16 includes a first data rate path 56 for converting network data between MII format and 10 Mb/s Manchester-encoded signals for transmission and reception at 10 Mb/s, and a second data rate path 58 for supporting communication at 100 Mb/s. The second data rate path 58 converts network data between MII format and a selected 100 Mb/s signal format, such as MLT-3 encoded signals.

The output of the data paths 56 or 58 is routed to the media independent interface 53, based on the data rate selected for communications between the link partner 50 and the repeater. Hence, network data from the link partner 50 is transmitted via the medium 52 to a physical interface 64 of the PHY transceiver 16 via a magnetic coupler 62. As known in the art, the magnetic coupler 62, coupled to the unshielded twisted pair (UTP) medium 52, provides AC coupling between the PHY interface 64 and the medium 52, plus electrical isolation. Depending on the determined data rate, the received analog network signals are supplied to the appropriate data path 56 or 58 to recover the network data in digital format from the received analog signals. The network data, recovered from the analog network signals, is then supplied by the appropriate data path 56 or 58 to the MII 53. Note that additional MIIs (not shown) may be coupled to support communication with additional link partners.

Conventionally, Media Independent Interfaces provide a parallel interface to support communication with parallel MAC devices. Therefore, a conventional MII has multiple transmit data input pins TXD supplied with data in a parallel code from the corresponding MAC device, and multiple receive data output pins RXD driven by a PHY device to transfer recovered data in a parallel code to the MAC device. For example, four pins TXD[3:0] and four pins RXD[3:0] may be provided for 4-bit transmit and receive data.

In addition, a conventional MII has transmit and receive clock outputs TX_CLK and RX_CLK for providing timing reference for the transfer of transmit and receive signals, transmit and receive enable inputs TX_EN and ENRCV for enabling data transmission and reception, a receive data valid output RV_DV for indicating which MII port is presenting recovered receive data, a carrier sense output CRS asserted on receive activity, a collision detection output COL asserted when a collision is detected on the transmit and receive paths, and transmit and receive error pins TX_ER and RX_ER for indicating invalid transmit and receive data.

To support a connection to a serial MAC, the transceiver 16 needs a General Purpose Serial Interface (GPSI) requiring multiple additional pins. In particular, the GPSI has a receive data output pin RX for transferring serial receive data and a transmit data input pin TX for accepting serial transmit data. Further, the GPSI should comprise transmit and receive clock outputs TCLK and RCLK, transmit and receive enable pins TENA and RENA, a collision output CLSN and a carrier sense output CRS.

To reduce the number of pins required to support parallel and serial interfaces to a MAC device, the MII 53 of the present invention is enabled to operate in a GPSI mode for 10 Mb/s data. In the GPSI mode, the least significant MII transmit data pin TXD[0] is mapped to the GPSI transmit data input TX, and the least significant MII receive data pin RXD[0] is mapped to the GPSI receive data output RX. The MII transmit data pins TXD[3:1] and receive data pins RXD[3:1] are not used in the GPSI mode.

Thus, in the MII mode, 10 Mb/s parallel transmit data stream TXD[3:0] and 10 Mb/s parallel receive data stream RXD[3:0] are respectively transferred via MII pins TXD[3:0] and RXD[3:0]. Therefore, the transmit data TXD[3:0] should be serialized before supplying to the transmit circuitry of the 10 Mb/s data path 56. Similarly, serial receive data recovered by the receive circuitry of the 10 Mb/s data path 56 should be converted into a parallel code before supplying to the MII pins RXD[3:0].

Figure 3:
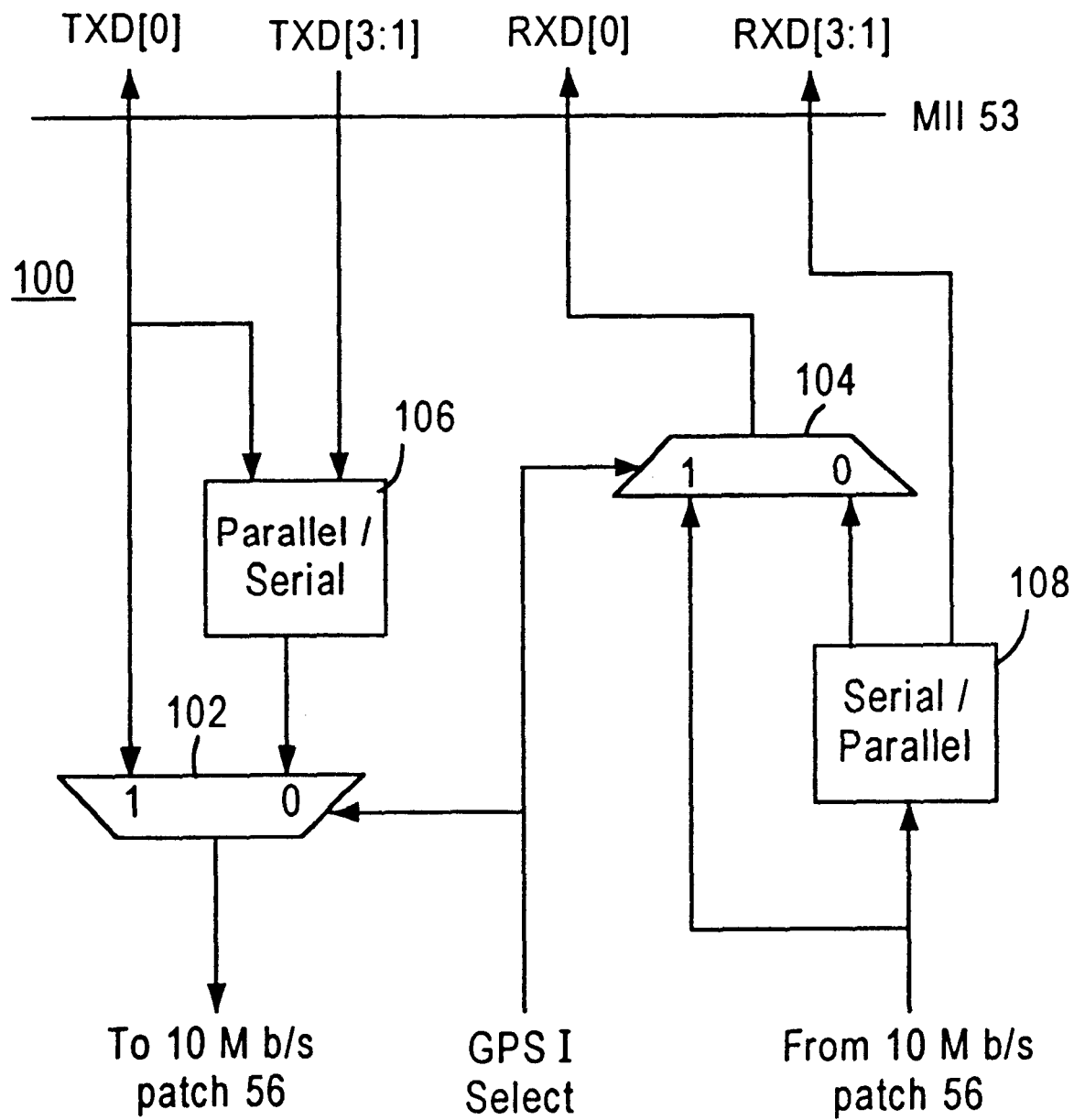
FIG. 3 is a diagram that illustrates switching a MII into a GPSI mode.

By contrast, in the GPSI mode, serial transmit data stream TX and serial receive data stream RX are respectively supplied via the MII1 pins TXD[0] and RXD[0]. Therefore, the parallel-to-serial conversion of the transmit data and the serial-to-parallel conversion of the receive data are not required. Referring to FIG. 3, a circuit 100 for enabling the MII interface to operate in a GPSI mode comprises multiplexers 102 and 104 controlled with a GPSI select signal that may be asserted by a user via a dedicated pin of the transceiver 16. The MII pin TXD[0] is connected to an input of the multiplexer 102. Another input of the multiplexer 102 is fed with an output signal of a parallel-to-serial converter, which transforms the parallel MII transmit data TXD[3:0] into a serial data stream. The output of the multiplexer 102 is supplied to the transmit circuitry of the 10 Mb/s data path 56.

The recovered serial receive data stream produced by the receive circuitry of the 10 Mb/s data path 56 is supplied to an input of the multiplexer 104 and to the serial-to parallel converter 108, which transforms the serial data stream into a parallel code. The least significant bit RXD[0] of the parallel receive data produced by the serial-to-parallel converter 108 is supplied to another input of the multiplexer 104. The output of the multiplexer 104 is connected to the pin RXD[0].

In the MII mode of operation, the GPSI select signal is not asserted. As a result, the multiplexer 102 passes the serialized MII transmit data TXD[3:0] to the transmit circuitry of the 10 Mb/s path 56, and the multiplexer 104 passes the least significant bit of the parallel MII receive data RXD[3:0] to the receive data pin RXD[0]. The other bits of the Mll receive data are supplied to the pins RXD[3:1].

In the GPSI mode, the GPSI select signal is asserted. A high level of this signal causes the multiplexer 102 to pass the serial transmit data from the pin TXD[0] directly to the transmit circuitry of the 10 Mb/s path 56. Also, the asserted GPSI select signal causes the multiplexer 104 to pass the receive data recovered by the receive circuitry of the 10 Mb/s data path 56 directly to the pin RXD[0].

Thus, in the GPSI mode, the TXD[0] and RXD[0] pins of the MII 53 are respectively mapped to GPSI pins TX and RX. The other MII pins are mapped to the corresponding GPSI pins as follows:

| MII | GPSI |
|---|---|
| TX_CLK | TCLK |
| TX_EN | TENA |
| RX_CLK | RCLK |
| ENRCV | ENRCV |
| RX_DV | RENA |
| COL | CLSN |
| CRS | CRS |

The unused MII pins are tied to ground.

Accordingly, the present invention enables the MII to operate in a GPSI mode for transferring 10 Mb/s transmit and receive data. As a result, the MII of the present invention is capable of supporting not only parallel MAC interfaces, but also serial MAC interfaces.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative way, rather than in a restrictive sense.

What is claimed is:

1. A network transceiver for transferring network signals between a media access control (MAC) device and a link partner provided on a network medium, the transceiver comprising:
   a physical layer device,
   a parallel interface for connecting the physical layer device and the MAC device, and
   a circuit for enabling the parallel interface to operate in a serial interface mode to transfer a serial data stream,
   wherein the parallel interface is a media independent interface (MII) conforming to IEEE Std. 802.3, and the enabling circuit allows the MII to operate as a General Purpose Serial Interface (GPSI).

2. The network transceiver of claim 1, wherein the physical layer device includes first and second data rate paths selected based on a rate of data communication with the link partner.

3. The network transceiver of claim 2, wherein the first data rate path generates corresponding network signals at 10 Mb/s, and the second data rate path generates corresponding network signals at 100 Mb/s.

4. The network transceiver of claim 2, wherein the enabling circuit places the parallel interface into the serial interface mode only for network signals transferred at the first data rate lower than the second data rate.

5. The network transceiver of claim 1, wherein the enabling circuit places the parallel interface into the serial interface mode when a serial mode select signal is asserted.

6. The network transceiver of claim 2, wherein the physical layer device comprises a parallel-to-serial converter for transforming parallel transmit MII data into a serial transmit data stream.

7. The network transceiver of claim 6, wherein the physical layer device further comprises a serial-to-parallel converter transforming a serial receive data stream produced by the first data rate path into a parallel receive MII data.

8. The network transceiver of claim 7, wherein the enabling circuit is controlled by a serial mode select signal for bypassing the parallel-to-serial converter in the serial interface mode.

9. The network transceiver of claim 8, wherein the enabling circuit is controlled by a serial mode select signal for bypassing the serial-to-parallel converter in the serial interface mode.

10. The network transceiver of claim 7, wherein the enabling circuit comprises a transmit multiplexer controlled by a control signal, and having a first input for receiving transmit data from a single pin of the parallel interface, and a second input coupled to an output of the parallel-to-serial converter.

11. The network transceiver of claim 10, wherein the transmit multiplexer passes the serial transmit data to the first data rate-path in response to a first state of the control signal.

12. The network transceiver of claim 11, wherein the transmit multiplexer passes the output of the parallel-to-serial converter to the first data rate path in response to a second state of the control signal.

13. The network transceiver of claim 7, wherein the enabling circuit comprises a receive multiplexer controlled by a control signal, and having a first input for receiving a serial transmit data from the second data rate path, and a second input coupled to an output of the serial-to-parallel converter.

14. The network transceiver of claim 13, wherein the receive multiplexer passes the serial receive data to a single pin of parallel interface in response to a first state of the control signal.

15. The network transceiver of claim 14, wherein the receive multiplexer passes the output of the parallel-to-serial converter to the parallel interface in response to a second state of the control signal.

16. The network transceiver of claim 1, wherein the network transceiver is integrated on a single chip.

17. In an Ethernet network, a method of transferring network data between a MAC device and a link partner provided on a network medium, comprising the steps of:
   arranging a media independent interface for connecting the MAC device and a physical layer device to transfer the data at first and second data rates, and
   configuring the media independent interface as a General Purpose Serial Interface for transferring the data at the first data rate lower than the second data rate.

* * * * *

UNITED STATES PATENT AND TRADEMARK OFFICE
CERTIFICATE OF CORRECTION

PATENT NO.    : 6,529,961 B1
DATED         : March 4, 2003
INVENTOR(S)   : Michael Richard Bray It is certified that error appears in the above-identified patent and that said Letters Patent is hereby corrected as shown below:

<u>Column 6,</u>
Line 37, change "pin of parallel interface" to -- pin of the parallel interface --

Signed and Sealed this

Sixth Day of May, 2003

JAMES E. ROGAN
*Director of the United States Patent and Trademark Office*